(12) United States Patent
Nakano

(10) Patent No.: US 11,154,914 B2
(45) Date of Patent: Oct. 26, 2021

(54) ULTRASONIC TRANSDUCER AND ULTRASONIC CLEANING DEVICE USING ULTRASONIC TRANSDUCER

(71) Applicant: KAIJO CORPORATION, Tokyo (JP)

(72) Inventor: Akihisa Nakano, Tokyo (JP)

(73) Assignee: KAIJO CORPORATION, Tokyo (JP)

( * ) Notice: Subject to any disclaimer, the term of this patent is extended or adjusted under 35 U.S.C. 154(b) by 243 days.

(21) Appl. No.: 16/607,885

(22) PCT Filed: Dec. 21, 2017

(86) PCT No.: PCT/JP2017/045948
§ 371 (c)(1),
(2) Date: Oct. 24, 2019

(87) PCT Pub. No.: WO2019/123610
PCT Pub. Date: Jun. 27, 2019

(65) Prior Publication Data
US 2020/0061677 A1    Feb. 27, 2020

(51) Int. Cl.
*B32B 37/00* (2006.01)
*B08B 3/12* (2006.01)
(Continued)

(52) U.S. Cl.
CPC .............. *B08B 3/12* (2013.01); *B06B 1/0651* (2013.01); *B06B 3/00* (2013.01); *B06B 2201/71* (2013.01)

(58) Field of Classification Search
USPC ........................................................ 134/184
See application file for complete search history.

(56) References Cited

U.S. PATENT DOCUMENTS 6,241,162 B1     6/2001  Takahashi et al.
2015/0283588 A1* 10/2015 Soejima ............ H01L 21/67051
                                                         134/1

FOREIGN PATENT DOCUMENTS

JP         56-146484       11/1981
JP         61-195694       12/1986
                        (Continued)

OTHER PUBLICATIONS

International Search Report dated Feb. 27, 2018 filed in PCT/JP2017/045948.

*Primary Examiner* — James D Sells
(74) *Attorney, Agent, or Firm* — Rankin, Hill & Clark LLP

(57) ABSTRACT

An ultrasonic transducer includes: a piezoelectric element having a plate-like shape and an area expansion vibration mode; and a vibration surface separated from main surfaces thereof and arranged in parallel to the main surfaces so as to be brought into contact with a liquid; a piezoelectric element receiving portion held in contact with a side surface of the piezoelectric element and configured to fix the piezoelectric element; and a vibration transmitting portion; and the vibration member having a space for surrounding the main surface formed by the vibration surface, the piezoelectric element receiving portion, and the vibration transmitting portion, wherein a vibration generated by the piezoelectric element is transmitted to the vibration surface through the piezoelectric element receiving portion and the vibration transmitting portion, and the vibration surface is vibrated in a direction orthogonal to a vibration direction in the area expansion vibration mode.

11 Claims, 12 Drawing Sheets

(51) Int. Cl.
*B06B 1/06* (2006.01)
*B06B 3/00* (2006.01)

(56) References Cited

FOREIGN PATENT DOCUMENTS

| | | |
|---|---|---|
| JP | H02-199994 A | 8/1990 |
| WO | 2014/084184 A1 | 6/2014 |
| WO | 2016/125702 A1 | 8/2016 |

* cited by examiner (a)

(b)

(a)

(b)

(c)

FIG. 10
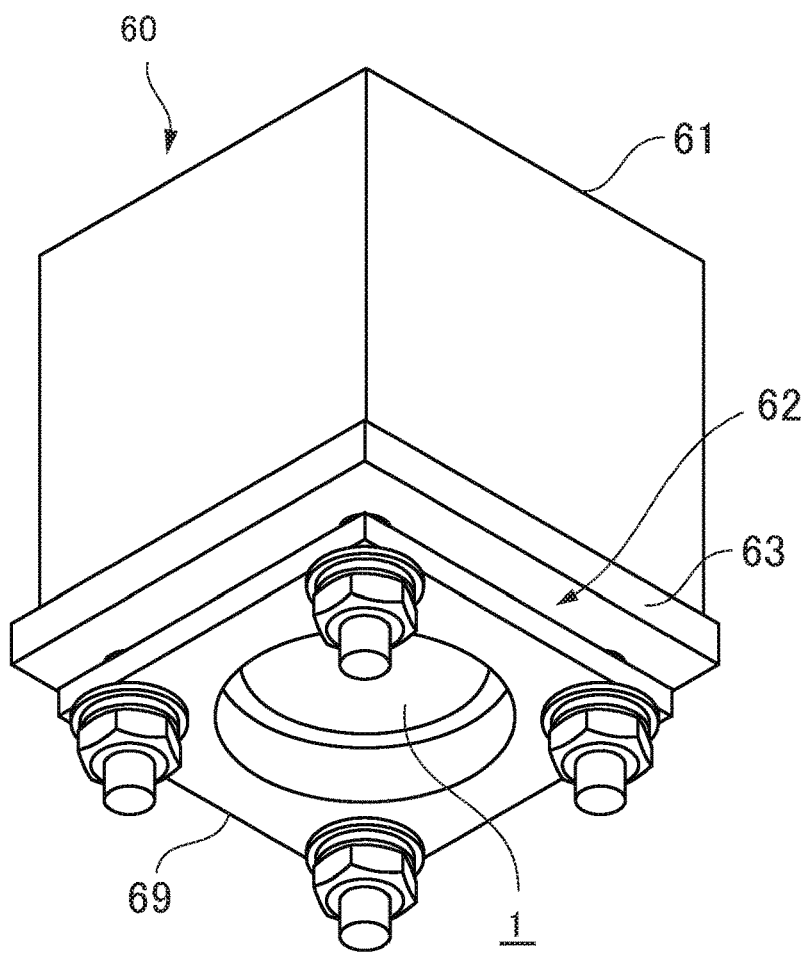
FIG. 2
FIG. 11
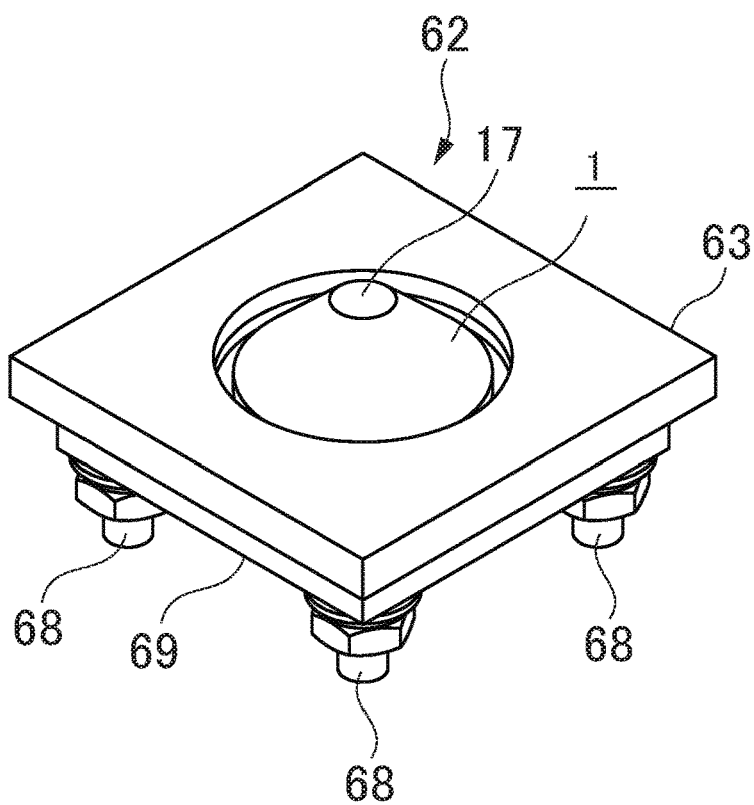

(a)

(b)

(c)

ULTRASONIC TRANSDUCER AND ULTRASONIC CLEANING DEVICE USING ULTRASONIC TRANSDUCER

BACKGROUND OF THE INVENTION

1. Field of the Invention

The present invention relates to an ultrasonic transducer configured to apply an ultrasonic vibration to a liquid and an ultrasonic cleaning device using the ultrasonic transducer, and more particularly, to an ultrasonic transducer, which has a small size, and is capable of generating an ultrasonic vibration at a low frequency, and a low-frequency spot shower type or cleaning bath type ultrasonic cleaning device using the ultrasonic transducer.

2. Description of the Related Art

Hitherto, an ultrasonic cleaning device generally includes an ultrasonic transducer mounted on a lower surface of a cleaning bath and performs cleaning in the following manner. After a cleaning liquid is supplied to the cleaning bath, an object to be cleaned is immersed into the cleaning bath and ultrasonic vibrations are applied to the lower surface of the cleaning bath so as to perform the cleaning.

Further, for cleaning of, for example, a liquid crystal panel and a semiconductor wafer, there is known a shower type ultrasonic cleaning device, which jets a cleaning liquid in a shower-like manner together with an ultrasonic wave to ultrasonically clean the above-mentioned objects to be cleaned.

For example, in Japanese Patent No. 3256198, there is disclosed a spot shower type ultrasonic cleaning device, for which an installation adjustment is easy without the need of a strict distance adjustment between a leading end of a nozzle and an object to be cleaned. The spot shower type ultrasonic cleaning device jets a cleaning liquid, to which an ultrasonic wave is applied, from the nozzle toward the object to be cleaned so as to remove contamination such as particles.

Based on the disclosure of Japanese Patent No. 3256198, the spot shower type ultrasonic cleaning device includes a nozzle, an ultrasonic transducer having a circular plate-like shape, and a liquid supply port for a cleaning liquid. The nozzle is mounted to a leading end of a casing. The ultrasonic transducer is arranged so as to be opposed to a rear end of the nozzle. The liquid supply port is formed in a side surface of the casing. A discharge hole of the nozzle is formed as a linear round hole having a constant diameter. A rear end surface of the nozzle is formed in a conical shape that is inclined downward at a predetermined inclination angle from an outer edge toward the discharge port.

The cleaning liquid supplied through the liquid supply port and the ultrasonic wave emitted from the ultrasonic transducer are ejected from the leading end of the nozzle to clean the object to be cleaned, which is arranged in front of the nozzle. With the arrangement described above, the ultrasonic wave emitted from the nozzle does not form a focal point, and hence there is no need of strict adjustment of the distance between the object to be cleaned and the leading end of the nozzle.

Further, the related-art spot shower type ultrasonic cleaning device uses the ultrasonic transducer having a resonance frequency equal to or higher than 400 kHz to apply ultrasonic vibrations to the cleaning liquid.

Meanwhile, in related-art ultrasonic cleaning using a low-frequency wave lower than 200 kHz, a cleaning bath is used. A whole cleaned object is immersed into the cleaning bath, and ultrasonic waves are radiated on a bottom surface and side surfaces of the cleaning bath so that the whole cleaning bath is irradiated, thereby performing cleaning.

Further, for the cleaning devices described above, a Langevin type transducer (BLT transducer) is used. A vibrator input for a general Langevin type transducer is 1 W/cm². Thus, the Langevin type transducer cannot be driven with large electric power, and vibrations are weak. Accordingly, a sufficient cleaning force cannot be obtained with use of only one Langevin type transducer. Thus, in order to radiate strong ultrasonic waves, a large number of Langevin type transducer s have been mounted to the cleaning bath to perform the cleaning.

The Langevin type transducer, which is mainly used for a cleaning device for a low frequency band (lower than 200 kHz), generates ultrasonic vibrations by being vibrated in a longitudinal direction of the vibrator.

In Japanese Patent No. 2961198, there is disclosed a frequency variable vibrator including electrodes each being provided to one surface and another surface of a piezoelectric vibrator having a disc (circular plate) shape. Divided electrodes are formed by dividing each of the electrodes provided on the one surface and the another surface into two. One of the two divided electrodes provided on the one surface of the piezoelectric vibrator and one of the two divided electrodes provided on the another surface thereof are connected to an oscillator, and a load impedance is connected to another one of the two divided electrodes provided on the one surface of the piezoelectric vibrator and another one of the two divided electrodes provided on the another surface of the piezoelectric vibrator. With the connections described above, the load impedance is changed, and a frequency of the oscillator is changed. In this manner, a diameter of the piezoelectric vibrator having the disc shape is equivalently changed to change a resonance frequency.

Further, in WO 2014/084184, there is described a piezoelectric actuator having a mechanism for allowing the actuator to magnify a deformation caused by expansion and contraction of a piezoelectric element as the related art. The piezoelectric actuator includes a plate-like elastic member having a projecting portion for forming an air gap portion in cooperation with the fixed piezoelectric element.

Based on the description of WO 2014/0841184, the piezoelectric actuator includes the plate-like deformation magnification element having the roof-like projecting portion formed by bending, which is fixed on a surface of the plate-like piezoelectric element having a rectangular shape as a surface shape. The roof-like projecting portion is formed at an approximate center of the deformation magnification element in a longitudinal direction thereof. The roof-like projecting portion has a trapezoidal or arc-like sectional shape in a direction perpendicular to a ridge line direction of the roof-like projecting portion, and forms the air gap portion having a trapezoidal sectional shape in cooperation with the piezoelectric element. In the piezoelectric actuator having the air gap portion described above, the piezoelectric element is formed of a piezoelectric ceramic, which causes a strain when a voltage is applied thereto. When an AC voltage (frequency voltage) is applied, strain and recovery (expansion and contraction actions) are regularly repeated in a plane direction thereof.

Meanwhile, the air gap portion is formed between the deformation magnification element and the piezoelectric element. Thus, the roof-like projecting portion of the deformation magnification element has a deformable structure as compared to an area of the deformation magnification element, which is fixed to the piezoelectric element. Thus, when the piezoelectric element expands and contracts in the plane direction, a shape of the roof-like projecting portion of the deformation magnification element is deformed to deform the roof-like projecting portion in a direction perpendicular to the plane direction of the piezoelectric element.

Further, in the piezoelectric actuator disclosed in WO 2014/084184, the elastic member including the deformation magnification element, which is hitherto made of, for example, a metal, is made of a crystalline resin to achieve a reduction in weight so as to improve an electric insulating property and a corrosion resistance.

The Langevin type transducer is mainly used as the vibrator for ultrasonic cleaning in a low frequency band (lower than 200 kHz). However, a length of the Langevin type transducer in the longitudinal direction thereof is proportional to a wavelength of a vibration frequency, and a size of the Langevin type transducer is increased in the longitudinal direction for use in the low frequency band. Thus, it is difficult to downsize the ultrasonic cleaning device.

Further, the vibrator input of the general Langevin-type transducer is 1 W/cm$^2$, and the Langevin-type transducer cannot be driven with large electric power. Thus, vibrations are weak, and a sufficient cleaning force cannot be obtained with use of one vibrator. Accordingly, a plurality of Langevin type transducers are used and mounted to the cleaning bath so that strong ultrasonic waves are radiated to the cleaning bath to perform cleaning.

Further, the casing of the related-art spot shower type cleaning device has a small size. Thus, it is difficult to assemble the Langevin type transducer into the casing. Further, a sufficient cleaning effect cannot be obtained with use of one Langevin type transducer. Thus, a small cleaning device for low frequency, which uses the Langevin type transducer, is not practical.

As described above, in the cleaning bath type cleaning device, the whole object to be cleaned is immersed into the cleaning bath, and the ultrasonic waves are radiated to the cleaning bath by the plurality of Langevin type transducers so as to perform cleaning. Thus, unlike the spot shower type cleaning device, an ultrasonic cleaning liquid cannot be ejected to a portion of the object to be cleaned, which is required to be cleaned, so as to clean the portion. Thus, the cleaning is required to be performed with use of a large amount of cleaning liquid, and it is difficult to perform the cleaning with a small amount of cleaning liquid.

For the frequency variable vibrator configured to change the resonance frequency, which is disclosed in Japanese Patent No. 2961198, a change in diameter of the ultrasonic transducer or a change in length of a metal block of the Langevin type transducer, which is hitherto required for generation of ultrasonic waves having different frequencies, is not required. In the frequency variable vibrator disclosed in Japanese Patent No. 2961198, however, the two divided electrodes are provided on each of the one surface and the another surface of the vibrator. The load impedance is connected to one of the two divided electrodes provided on each of the one surface and the another surface to change the load impedance so as to change the frequency of the oscillator. Thus, the configuration of the divided electrodes obtained by dividing the electrode into two and the connection of the load impedance to one of the divided electrodes complicate the configuration.

Further, the disc type piezoelectric element, which is used in the related-art spot shower type cleaning device, has a resonance frequency in a thickness direction of the piezoelectric element and a resonance frequency in a radial direction thereof. It is known that the resonance frequency of the piezoelectric element in the radial direction is lower than the resonance frequency in the thickness direction. Further, the resonance frequency of the piezoelectric element in the radial direction can be changed by changing a magnitude of a diameter of the piezoelectric element.

However, the radial vibration has a vibration behavior different from a vibration behavior of the thickness vibration of a circular plate used in the related-art spot shower type cleaning device in the thickness direction, and thus has not been put into practical use. Accordingly, a downsized low-frequency ultrasonic transducer for cleaning, such as a spot shower type one is demanded.

SUMMARY OF INVENTION

Accordingly, the present invention has an object to provide an ultrasonic transducer having a small size, which is capable of generating ultrasonic vibrations at a low frequency, and includes a piezoelectric element having a transverse effect in an area expansion vibration mode and a vibration member configured to form a space for surrounding main surfaces of the piezoelectric element, in which a vibration surface, which is separated from the main surfaces of the piezoelectric element, and is arranged in parallel to the main surfaces so as to be brought into contact with a liquid, is formed at a leading end of the vibration surface, and the vibration surface is vibrated in a direction orthogonal to a vibration direction in the area expansion vibration mode to apply ultrasonic vibrations to the liquid, and a low-frequency spot shower type or cleaning bath type ultrasonic cleaning device using the ultrasonic transducer.

In order to achieve the above-mentioned object, according to at least one embodiment of present invention, there is provided an ultrasonic transducer configured to apply an ultrasonic vibration to a liquid, the ultrasonic transducer including: a piezoelectric element, which has a plate-like shape, and has an area expansion vibration mode; and a vibration member including a vibration surface, which is separated from main surfaces of the piezoelectric element, and is arranged in parallel to the main surfaces so as to be brought into contact with the liquid, a piezoelectric element receiving portion, which is held in contact with a side surface of the piezoelectric element, and is configured to fix the piezoelectric element, and a vibration transmitting portion for connecting the vibration surface and the piezoelectric element receiving portion, the vibration member having a space for surrounding the main surface, which is formed by the vibration surface, the piezoelectric element receiving portion, and the vibration transmitting portion, wherein a vibration generated by the piezoelectric element is transmitted to the vibration surface through the piezoelectric element receiving portion and the vibration transmitting portion, and the vibration surface is vibrated in a direction orthogonal to a vibration direction of the piezoelectric element in the area expansion vibration mode.

According to the ultrasonic transducer of the present invention, the ultrasonic vibration has a vibration frequency of 200 kHz or lower.

According to the ultrasonic transducer of the present invention, a vibration in the area expansion vibration mode is a vibration caused by a transverse effect, and includes a length vibration, an area vibration, and a radial vibration.

According to the ultrasonic transducer of the present invention, the piezoelectric element is formed in a circular plate-like shape, and the vibration member is formed in a truncated conical shape or a columnar shape, which has the vibration surface at a leading end.

According to the ultrasonic transducer of the present invention, the piezoelectric element is formed in a protruding polygonal shape, and the vibration member is formed in a truncated pyramid shape or a prismatic shape, which corresponds to the protruding polygonal shape having the vibration surface at a leading edge.

The ultrasonic transducer of the present invention further includes a flange portion formed so as to be continuous with the piezoelectric element receiving portion, wherein the flange portion extends in the vibration direction in the area expansion vibration mode.

According to the ultrasonic transducer of the present invention, the piezoelectric element has a hole portion passing through the main surfaces of the piezoelectric element.

According to the ultrasonic transducer of the present invention, the hole portion is formed at an approximate center of the main surfaces.

According to the ultrasonic transducer of the present invention, the piezoelectric element is fixed to the vibration member through fitting or an adhesive.

According to an embodiment of the present invention, there is provided an ultrasonic cleaning device of a spot shower type, which is configured to jet a cleaning liquid in a shower-like manner, the ultrasonic cleaning device including the ultrasonic transducer provided in the ultrasonic cleaning device, and is configured to apply an ultrasonic vibration to the cleaning liquid.

The ultrasonic cleaning device of the present invention is configured to store a cleaning liquid in a cleaning bath and immerse an object to be cleaned into the cleaning bath so as to perform cleaning, the ultrasonic cleaning device including the ultrasonic transducer provided inside the cleaning bath, and is configured to apply an ultrasonic vibration to the cleaning liquid.

According to an embodiment of the present invention, after the radial vibration being the vibration caused by the transverse effect of the area expansion vibration of the piezoelectric element is converted to the vibration in the direction orthogonal to the vibration direction of the radial vibration in the area expansion vibration mode with use of the vibration member without using a thickness vibration of a circular plate of a piezoelectric element as used in the related art, vibrations at a low frequency are generated. Thus, even the ultrasonic transducer, which generates vibrations at a low frequency, can be downsized.

Further, as a result of the downsizing of the piezoelectric element, which is achieved with use of the piezoelectric element having the area expansion vibration mode, the piezoelectric element can be mounted to a casing of a related-art spot shower type ultrasonic cleaning device.

Further, with adaptation of a spot shower type as a cleaning mode, a portion of an object to be cleaned, which is required to be cleaned, can be selected. Hence, the amount of cleaning liquid required for cleaning can be reduced.

Further, a Langevin vibrator, which has been hitherto used, has a length in a longitudinal direction of the Langevin vibrator, which varies depending on a vibration frequency. Thus, for a low vibration frequency, a thickness of the vibrator is increased. Meanwhile, resonance frequency of a circular plate type piezoelectric ceramic for the piezoelectric element can be changed by changing a magnitude of a diameter of the circular plate type piezoelectric ceramic. Thus, the circular plate type piezoelectric ceramic can be downsized without increasing a thickness of the vibrator depending on the vibration frequency.

Further, as a vibrator input for the piezoelectric ceramic for the piezoelectric element, electric power up to about 10 W/cm$^2$ can be input, and hence large vibrations can be obtained. Thus, a sufficient cleaning force can be obtained with use of even one piezoelectric element.

Further, the piezoelectric element of the ultrasonic transducer according to the embodiment of the present invention has the area expansion vibration mode. The piezoelectric element can be formed to have such a shape that is surrounded by the vibration member and is easily shielded, such as a circular plate-like shape or a protruding polygonal shape. Thus, contact of the piezoelectric element with the liquid can easily be prevented.

The ultrasonic transducer according to the embodiment of the present invention can also be used for the ultrasonic cleaning device including a cleaning bath.

Further, the piezoelectric ceramic for the piezoelectric element can generate strong vibrations, and thus can be applied to a dispersion treatment or an emulsification treatment, which uses the ultrasonic vibrations.

BRIEF DESCRIPTION OF THE DRAWINGS

FIG. 1 are views for illustrating an exterior of an ultrasonic transducer according to the present invention, in which FIG. 1A is a perspective view of the ultrasonic transducer when viewed from above, and FIG. 1B is a perspective view of the ultrasonic transducer when viewed from below.

FIG. 6 are views for illustrating a vibration behavior of a vibration member of the ultrasonic transducer, in which FIG. 6A is a view for illustrating a deformed state of the vibration member when the piezoelectric element shrinks in a radial direction thereof, FIG. 6B is a view for illustrating a state after the vibration member of the ultrasonic transducer is returned to a normal state, and FIG. 6C is a view for illustrating a deformed state of the vibration member when the piezoelectric element expands in the radial direction.

FIG. 10 is a perspective view for illustrating mounting of the ultrasonic transducer assembled to a bottom portion (bottom face) of a cleaning bath in a cleaning bath type ultrasonic cleaning device.

FIG. 11 is a perspective view for illustrating the mounting of the ultrasonic transducer assembled to the bottom portion of the cleaning bath in the cleaning bath type ultrasonic cleaning device when viewed from above.

FIG. 14 are configuration diagrams for illustrating a cleaning bath having a vibrator mounting flat plate onto which a plurality of the ultrasonic transducers are mounted, in which FIG. 14A is a perspective view of the cleaning bath when viewed from a bottom portion, FIG. 14B is a plan view of the cleaning bath, and FIG. 14C is a partial sectional view taken along the line C-C of FIG. 14B.

DETAILED DESCRIPTION OF EMBODIMENT

Now, with reference to the drawings, a mode for achieving an ultrasonic transducer and an ultrasonic cleaning device using an ultrasonic transducer according to the present invention is described. The present invention relates to an ultrasonic transducer configured to apply ultrasonic vibrations to a liquid and an ultrasonic cleaning device using an ultrasonic transducer. In particular, the ultrasonic transducer has a small size and can generate ultrasonic vibrations at a low frequency. With use of the ultrasonic transducer for a spot shower type or cleaning bath type ultrasonic cleaning device, ultrasonic vibrations at a low frequency of 200 kHz or lower can be generated. Thus, even the device, which generates ultrasonic vibrations at a low frequency, can be downsized.

[Configuration of Ultrasonic Transducer]

First, an ultrasonic transducer configured to apply ultrasonic vibrations to a liquid such as a cleaning liquid is described with reference to FIG. 1 to FIG. 3.

Figure 1:
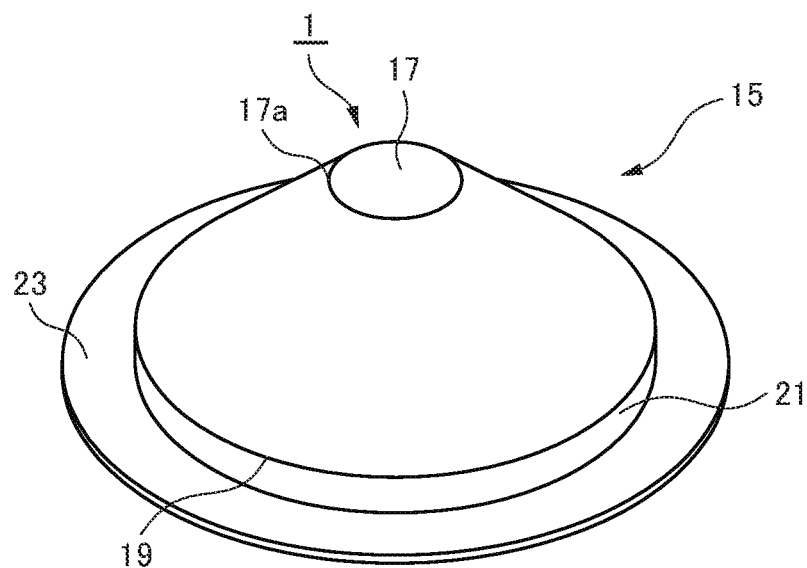
Figure 1:
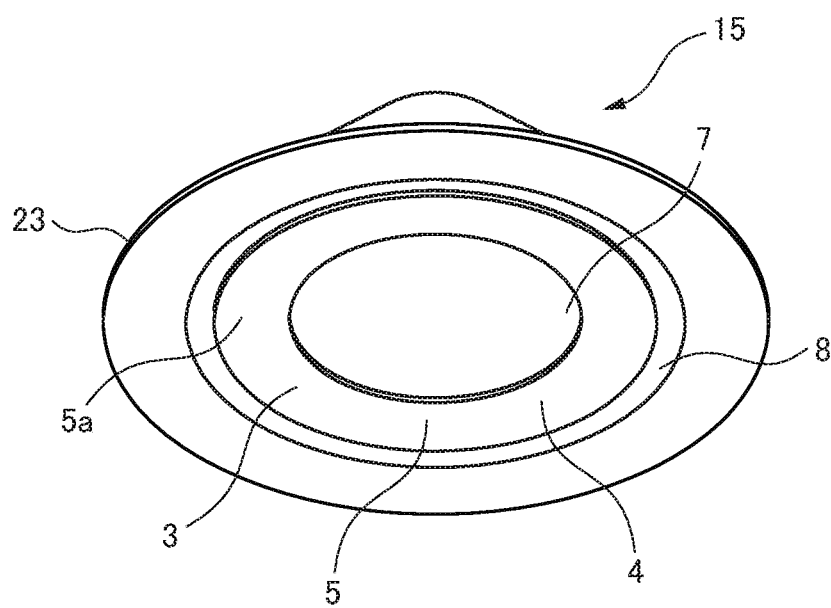

FIG. 1 are views for illustrating an exterior of an ultrasonic transducer according to the present invention, in which FIG. 1A is a perspective view of the ultrasonic transducer when viewed from above, and FIG. 1B is a perspective view of the ultrasonic transducer when viewed from below. FIG. 2A is a front view of the ultrasonic transducer according to the present invention, FIG. 2B is a plan view of the ultrasonic transducer, FIG. 2C is a bottom view of the ultrasonic transducer, and FIG. 3 is a sectional view taken along the line A-A of FIG. 2A.

Figure 2:
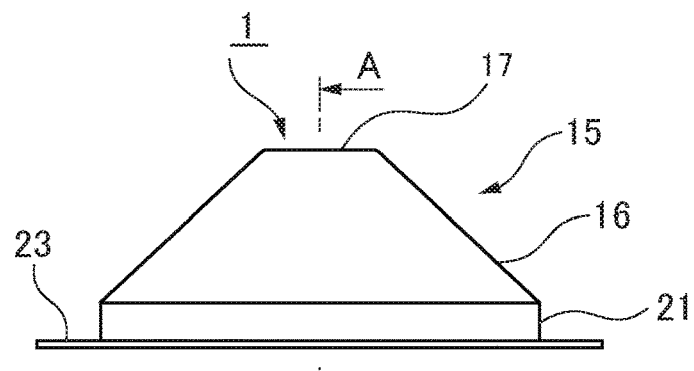
FIG. 2A is a front view of the ultrasonic transducer according to the present invention.
FIG. 2B is a plan view of the ultrasonic transducer.
FIG. 2C is a bottom view of the ultrasonic transducer.
Figure 2:
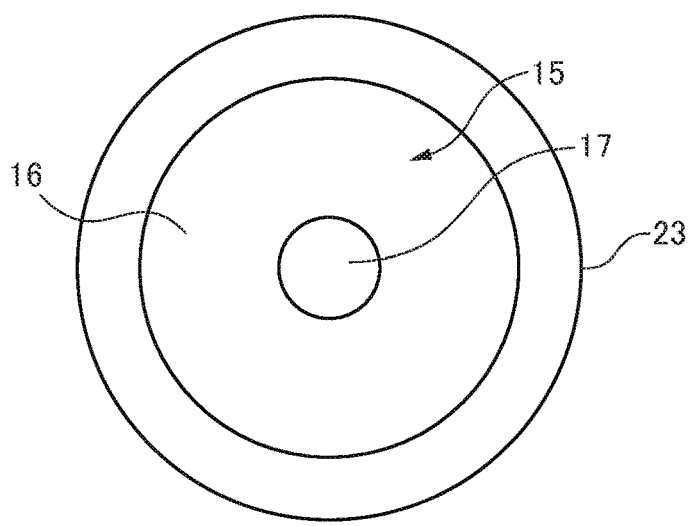
Figure 2:
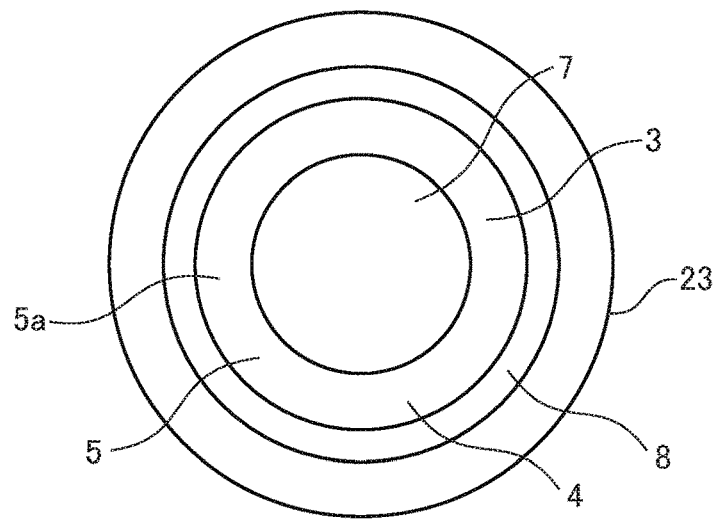
Figure 3:
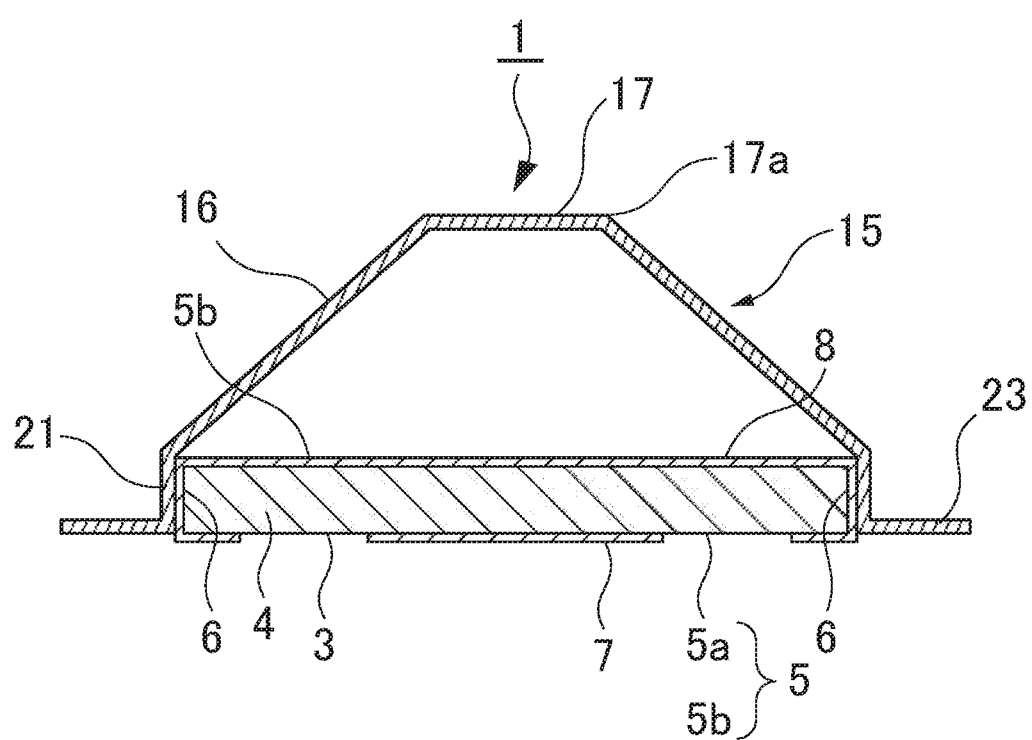
FIG. 3 is a sectional view taken along the line A-A of FIG. 2A.

As illustrated in FIG. 1 to FIG. 3, an ultrasonic transducer 1 includes a piezoelectric element 3 configured to generate ultrasonic vibrations and a vibration member 15 configured to apply the ultrasonic vibrations to a cleaning liquid.

[Piezoelectric Element]

The piezoelectric element 3 includes a piezoelectric member having a plate-like shape and electrodes provided on both surfaces of the piezoelectric member. The piezoelectric member of the piezoelectric element is made of a ceramic, which is obtained by compression molding of various types of oxides and sintering at a high temperature. The ceramic is a piezoelectric ceramic having a piezoelectricity, which is obtained through polarization processing with application of a DC electric field to electrodes.

As illustrated in FIG. 1B, FIG. 2C, and FIG. 3, the piezoelectric element 3 has a predetermined thickness, and is formed of, for example, a piezoelectric ceramic 4 having a circular plate-like shape (referred to as "circular plate type piezoelectric ceramic"). On both circular surfaces (main surfaces 5) of the piezoelectric ceramic 4, electrodes are formed, respectively.

One electrode (first electrode) 7 formed on the piezoelectric ceramic 4 is formed in the vicinity of a center of one main surface 5a being a front surface so as to have a circular shape smaller than a diameter of the piezoelectric member. Another electrode (second electrode) 8 is formed of an electrically conductive member to form an annular shape on the one main surface 5a having a circular shape so as to cover a radial end portion of the one main surface 5a, another main surface 5b being a back surface, and a side surface 6 (shown in FIG. 3).

The circular plate type piezoelectric ceramic 4 of the piezoelectric element 3 is vibrated in an area expansion vibration mode with application of an AC voltage (electric power) having a resonance frequency of a radial vibration across the electrodes. For example, the side surface (end face) 6 of the circular plate type piezoelectric ceramic 4 is deformed in a radial direction of the circular plate type piezoelectric ceramic 4 to be vibrated.

The area expansion vibration is a vibration mode for applying an electric field to the piezoelectric element to cause polarization so as to use a transverse effect of generating a stress in a direction perpendicular to an electric field direction. The area expansion vibration includes a length vibration, an area vibration, and a radial vibration, and is a behavior of vibrating in a direction perpendicular to a polarization direction of the piezoelectric element. Further, for a resonance frequency in each of the vibration modes, the resonance frequency varies in inverse proportion to a length of a long side of a front surface having a rectangular shape in the length vibration, varies in inverse proportion to a length of one side of a front surface having a square shape in the area vibration, and varies in inverse proportion to a diameter of a front surface having a circular shape in the radial vibration.

As an example of a size of the piezoelectric element 3 using the piezoelectric ceramic 4, a diameter is 20 mm and a thickness is 7 mm. A resonance frequency is 140 kHz. The size and the resonance frequency of the piezoelectric element 3 are not limited to the size and the resonance frequency exemplified above, and may be suitably changed for use.

For the piezoelectric member of the piezoelectric element 3, the piezoelectric ceramic is suitable. However, the piezoelectric member is not limited to the piezoelectric ceramic.

Figure 4:
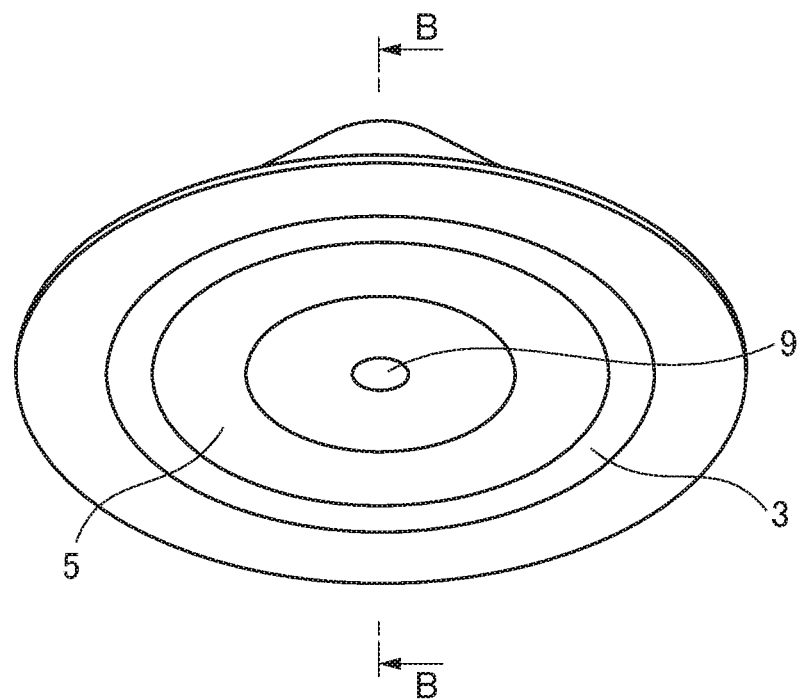
FIG. 4 is a perspective view of the ultrasonic transducer using a piezoelectric element having an annular shape, which has a hole portion at an approximate center of main surfaces when the ultrasonic transducer is viewed from below.

A shape of the piezoelectric element 3 is not limited to the circular plate-like shape, and may be other shapes. For example, the piezoelectric element may also have a shape illustrated in FIG. 4 and FIG. 5. FIG. 4 is a perspective view of an ultrasonic transducer using the piezoelectric element having an annular shape, which has a hole portion formed at an approximate center of the main surfaces, when viewed from below, and FIG. 5 is a sectional view taken along the line B-B of FIG. 4.

Figure 5:
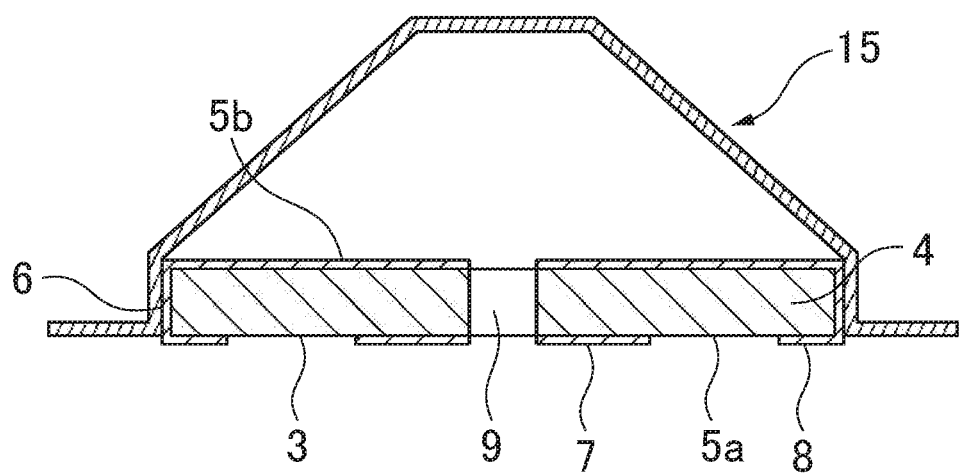
FIG. 5 is a sectional view taken along the line B-B of FIG. 4.

As illustrated in FIG. 4 and FIG. 5, the piezoelectric element having the annular shape has a hole portion 9 passing through both surfaces (main surfaces 5) of the piezoelectric element 3, which is formed at the approximate center of the main surfaces 5. The piezoelectric element 3 includes the piezoelectric ceramic 4 having the annular shape (referred to as "annular type piezoelectric ceramic").

The piezoelectric element including the annular type piezoelectric ceramic 4 includes the electrodes provided on both surfaces (main surfaces 5) as in the case of the piezoelectric element including the circular plate type piezoelectric ceramic 4. One electrode (first electrode) 7 is formed in the vicinity of the center of one main surface 5a being a front surface so as to have an annular shape smaller than a diameter of the piezoelectric member. Another electrode (second electrode) 8 is formed of an electrically conductive member to form an annular shape on the one main surface 5a having the circular shape so as to cover the radial end portion of the one main surface 5a, the another main surface 5b being the back surface, and the side surface 6 (shown in FIG. 5). The vibration member 15 illustrated in FIG. 5 has the same configuration as that of the vibration member 15 illustrated in FIG. 1.

The piezoelectric element 3 may be formed in a protruding polygonal shape, for example, may be formed to have a regular polygonal shape such as a regular hexagonal shape.

As described above, a vibration frequency of the piezoelectric element 3 using the piezoelectric ceramic 4 in the area expansion vibration is a low frequency equal to or lower than 200 kHz. Thus, ultrasonic vibrations at a low frequency equal to or lower than 200 kHz can be generated.

As described above, the piezoelectric element 3 having, for example, the circular plate-like shape has a resonance frequency in a thickness direction of the piezoelectric element 3 and a resonance frequency in a radial direction thereof. It is known that the resonance frequency of the piezoelectric element 3 in the radial direction is lower than the resonance frequency in the thickness direction. Further, the resonance frequency of the piezoelectric element 3 in the radial direction can be changed by changing a magnitude of a diameter of the piezoelectric element 3.

However, the radial vibration of the piezoelectric element 3 has a vibration behavior different from a vibration behavior of a thickness vibration of a circular plate, which is a vibration caused by a longitudinal effect of a piezoelectric element used for a related-art spot shower type device. Thus, as a result of trial and error, the inventor of the present invention has arrived at the use of a vibration in a direction orthogonal to a vibration direction of the radial vibration of the piezoelectric element, which is obtained through conversion, so as to put a downsized low-frequency ultrasonic transducer for cleaning into practical use. Specifically, the vibration member 15 is provided to the piezoelectric element 3 so that the vibration member 15 acts as a vibration-direction converter configured to convert the radial vibration of the piezoelectric element 3 into the vibration in the direction orthogonal to the vibration direction of the radial vibration.

[Configuration of Vibration Member]

Now, the vibration member in the ultrasonic transducer 1 is described with reference to FIG. 1 to FIG. 3. The vibration member 15 is configured to convert the radial vibration of the piezoelectric element 3 into the vibration in the direction orthogonal to the vibration direction of the radial vibration and apply the ultrasonic vibrations to the liquid such as the cleaning liquid.

As illustrated in FIG. 1, FIG. 2A, and FIG. 3, the vibration member 15 configured to apply the ultrasonic vibrations to the liquid such as the cleaning liquid includes a vibration surface 17, a piezoelectric element receiving portion 21, a vibration transmitting portion 16, and a flange portion 23, which are formed integrally with each other. The vibration surface 17 is configured to apply the vibrations generated by the piezoelectric element to the liquid. The piezoelectric element receiving portion 21 is configured to accommodate and fix the piezoelectric element 3. The vibration transmitting portion 16 has a truncated conical shape, and connects the vibration surface 17 and the piezoelectric element receiving portion 21. The flange portion 23 is used for fixation to a casing.

As illustrated in FIG. 3, the vibration member 15 is hollow. The vibration surface 17 is located within a region defined by perpendicular lines extending from ends of the main surfaces 5, more specifically, the another main surface 5b of the piezoelectric element 3 on a side view. An outer side of the vibration surface 17 is held in contact with the liquid (cleaning liquid). The vibration surface 17 is separated from the main surfaces 5, more specifically, the another main surface 5b of the piezoelectric element 3, and is arranged in parallel to the main surfaces 5.

As illustrated in FIG. 1A and FIG. 2B, the vibration surface 17 located at a leading end of the vibration transmitting portion 16 has a circular front surface having an intersection point with a center axis of the vibration transmitting portion 16 in a tapered direction thereof as a center.

As illustrated in FIG. 1A, a surface of the vibration transmitting portion 16 between an end 17a of the vibration surface 17 located on an upper side of the vibration transmitting portion 16 and a lower end 19 of the vibration transmitting portion 16, which is located on the opposite side, is an inclined surface corresponding to a curved surface.

As illustrated in FIG. 3, the piezoelectric element receiving portion 21 located on a lower side of the vibration transmitting portion 16 has a short columnar shape, which accommodates the piezoelectric element 3 therein and is formed along the lower end 19 of the vibration transmitting portion 16.

As illustrated in FIG. 3, the piezoelectric element receiving portion 21 of the vibration member 15 is held in contact with the side surface 6 of the piezoelectric element 3 so as to surround the piezoelectric element 3, and expands and contacts to be vibrated in the same direction as the vibration direction of the piezoelectric element 3 in the area expansion vibration mode. Further, the side surface 6 of the piezoelectric element 3 is fixed to the piezoelectric element receiving portion 21 of the vibration member 15 through fitting or an adhesive. With the fixation, the vibrations of the piezoelectric element 3 are transmitted to the vibration surface 17 through the piezoelectric element receiving portion 21 and the vibration transmitting portion 16, and hence the vibration surface 17 is vibrated in the direction orthogonal to the vibration direction in the area expansion vibration mode.

The flange portion 23 is formed so as to be continuous with a lower end of the piezoelectric element receiving portion 21 having the short columnar shape. The flange portion 23, which is formed so as to be continuous with the lower end of the piezoelectric element receiving portion 21, is located on the side opposite to the vibration surface 17, and is formed of a flat plate having a ring shape, which is expandable and contractable in the vibration direction of the piezoelectric element 3 in the area expansion vibration mode. The ultrasonic transducer 1 is mounted to, for example, a casing of a cleaning device by pressing a surface of the flange portion 23.

As a member for the vibration member 15, for example, stainless steel is used. The member for the vibration member 15 is not limited to stainless steel. Other members, for example, titanium may also be used.

As described above, the vibration transmitting portion 16 of the vibration member 15, which connects the vibration surface 17 and the piezoelectric element receiving portion 21, is formed to extend so as to be located within the region defined by the perpendicular lines extending from the ends of the main surfaces 5 of the piezoelectric element 3. The piezoelectric element 3 expands and contracts to be vibrated in the vibration direction in the area expansion vibration mode. As a result, the front surface of the vibration surface 17 formed in parallel to the piezoelectric element 3 so as to be separate therefrom is vibrated in the direction orthogonal to the vibration direction of the piezoelectric element 3 in the area expansion vibration mode. Accordingly, the vibration surface 17 located in contact with an upper portion of the vibration transmitting portion 16 serves as a main vibration surface for applying the ultrasonic vibrations to the cleaning liquid. Further, the vibration member 15 forms a space for surrounding the main surface 5, more specifically, the another main surface 5b of the piezoelectric element 3 in cooperation with the vibration surface 17, the piezoelectric element receiving portion 21, and the vibration transmitting portion 16.

The vibration member is formed in the truncated conical shape having the vibration surface at the leading end in the above-mentioned mode. However, the vibration member may be formed in a columnar shape in place of the truncated conical shape. With the formation of the vibration member in the columnar shape, a vibration surface having a diameter close to a magnitude of the diameter of the piezoelectric element can be formed.

When the piezoelectric element 3 is formed in the protruding polygonal shape, the vibration member 15 is formed in a truncated pyramid shape or a prismatic shape, which corresponds to the protruding polygonal shape of the piezoelectric element 3 having the vibration surface 17 as the leading end.

Further, with use of the annular type piezoelectric ceramic 4 for the piezoelectric element in the ultrasonic transducer illustrated in FIG. 4 and FIG. 5, the annular type piezoelectric ceramic 4 can externally discharge a volatile component of an adhesive, which is generated inside the vibration transmitting portion 16 in an assembly step of the ultrasonic transducer, through the hole portion 9 formed in the vicinity of the center. Further, the annular type piezoelectric ceramic can keep the inside of the vibration member 15 in, for example, a cleaning device at an atmospheric pressure and a temperature around the ultrasonic transducer 1. Thus, the annular type piezoelectric ceramic 4 can be suitably used in accordance with a usage environment.

[Vibration Behavior of Vibration Member]

Figure 6:
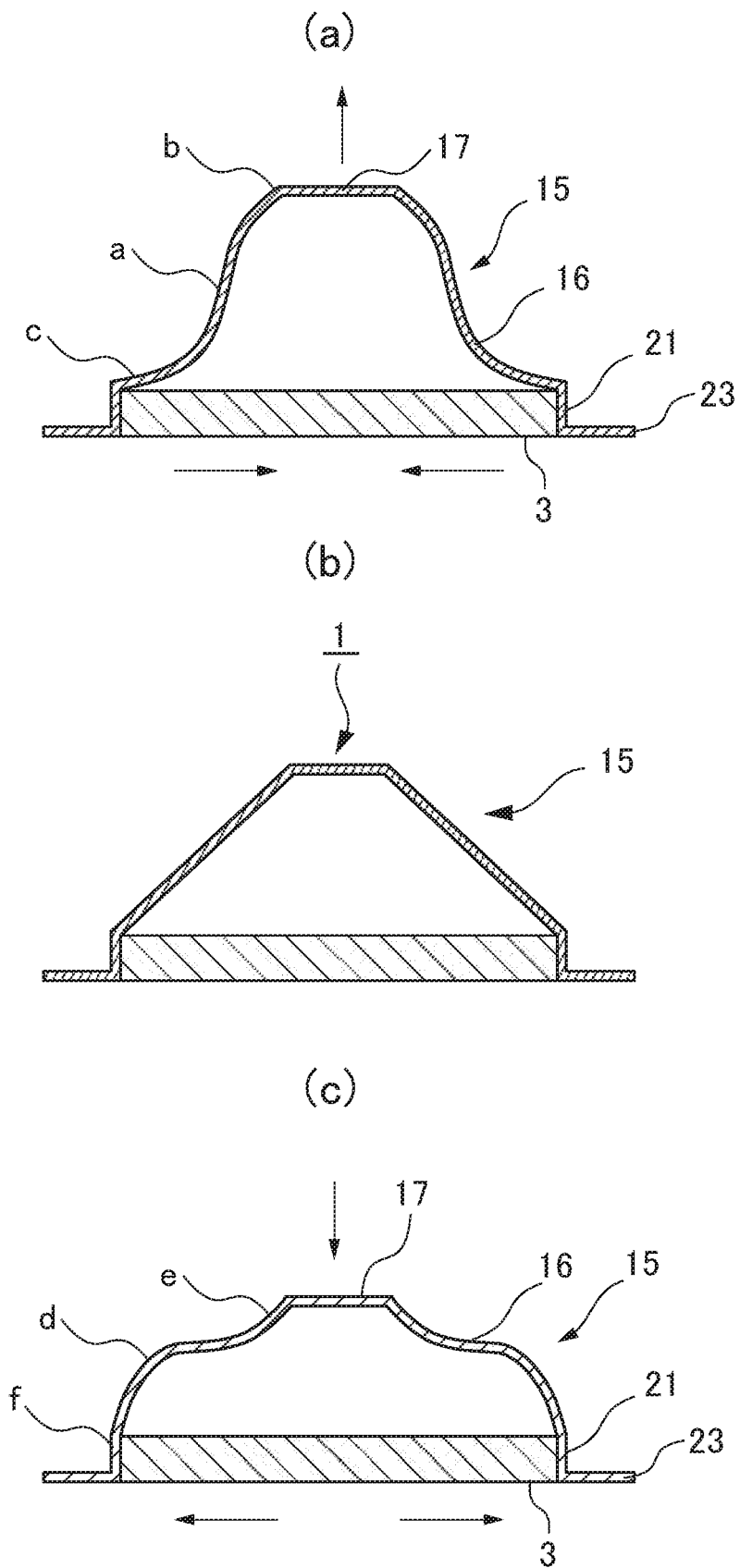

Next, a vibration behavior of the vibration member of the ultrasonic transducer is described with reference to FIG. 6. FIG. 6 are views for illustrating a vibration deformation behavior of the vibration member of the ultrasonic transducer, in which FIG. 6A is a deformed state of the vibration member when the piezoelectric element shrinks in a radial direct on thereof, FIG. 6B is a view for illustrating a state after the vibration member of the ultrasonic transducer is returned to a normal shape, and FIG. 6C is a view for illustrating a deformed state of the vibration member when the piezoelectric element expands n the radial direction. In FIG. 6, the illustration of the electrodes provided on the surfaces of the piezoelectric element is omitted.

Electric power having a resonance frequency in the area expansion vibration mode is input to the piezoelectric element 3 by an ultrasonic oscillator (not shown) to thereby cause the piezoelectric element 3 to generate a radial vibration. For example, a voltage (electric power) of positive polarity is applied to the first electrode 7 of the piezoelectric element 3 illustrated in FIG. 3 by the ultrasonic oscillator, and a voltage (electric power) of negative polarity is applied to the second electrode 8. As a result, in the vibration member 15, the side surface 6 of the piezoelectric element 3 is deformed in the radial direction due to area expansion vibrations of the piezoelectric element 3. As a result, the piezoelectric element receiving portion 21 of the vibration member 15, which is caused to adhere to the side surface 6 of the piezoelectric element 3, is deformed n the radial direction.

As illustrated in FIG. 6A, in the vibration member 15, the piezoelectric element 3 is deformed so as to shrink in the radial direction indicated by the arrows. As a result, the piezoelectric element receiving portion 21 of the vibration member 15 is deformed so as to shrink in the same direction as the direction of the deformation of the piezoelectric element 3. At this time, the vibration transmitting portion 16 (the inclination surface thereof) of the vibration member 15 is deformed. As a result, a portion of the inclination surface, which is located between the vicinity of a center (indicated by "a" in FIG. 6A) of the inclination surface in a height direction and a peripheral end (indicated by "b" in FIG. 6B) of the vibration surface 17, has a steep inclination in the vicinity of the center (indicated by "a" in FIG. 6A), and the inclination becomes gradually gentle toward the vicinity of the vibration surface 17. Under the above-mentioned state, the vibration surface 17 expands to be deformed in the direction (indicated by the arrow) orthogonal to the radial vibration of the piezoelectric element 3.

Further, as a result of shrinkage of the piezoelectric element 3 in the radial direction, a portion of the inclination surface of the vibration transmitting portion 16, which is located between the vicinity of the center of the inclination surface of the vibration transmitting portion 16 and a leading end (indicated by "c" in FIG. 6A) of a lower portion of the vibration transmitting portion 16, specifically, an end on the piezoelectric element receiving portion 21 side, is deformed so as to form a gentle inclination.

Further, the piezoelectric element receiving portion 21 is deformed in the same direction as that of the deformation of the piezoelectric element 3. At the same time, the flange portion 23 is also deformed so as to shrink in the radial direction. As a result, the vibration surface 17 formed continuous with the vibration transmitting portion 16 is located at a higher position.

Next, magnitudes of the voltages (electric powers) applied to the first electrode 7 and the second electrode 8 of the piezoelectric element 3 are decreased to zero by the ultrasonic oscillator. As a result, as illustrated in FIG. 6B, the vibration member 15 of the ultrasonic transducer 1 is temporarily returned to a normal shape.

Next, a voltage (electric power) of negative polarity is applied to the first electrode 7 of the piezoelectric element 3, and a voltage (electric power) of positive polarity is applied to the second electrode 8. As a result, after the vibration member 15 is returned to the normal shape, the piezoelectric element 3 is deformed so as to expand in the radial direction.

As illustrated in FIG. 6C, in the vibration member 15, the piezoelectric element 3 is deformed so as to expand in the radial direction indicated by the arrows. As a result, the piezoelectric element receiving portion 21 of the vibration member 15 is deformed in the same direction as the direction of the deformation of the piezoelectric element 3. At this time, the inclination surface of the vibration transmitting portion 16 of the vibration member 15 is deformed. As a result, a portion of the inclination surface, which is located between the vicinity of the center (indicated by "d" in FIG.

6C) of the inclination surface in the height direction and an end 17a (indicated by "e" in FIG. 6C) of the vibration surface is inclined so as to be approximately flat in the vicinity of the center of the inclination surface and have a slightly gentle inclination toward the vicinity of the vibration surface 17. Under the above-mentioned state, the vibration surface 17 contracts and is deformed in the direction indicated by the arrow, which is orthogonal to the vibration direction of the piezoelectric element.

Further, as a result of expansion of the piezoelectric element 3 in the radial direction, a portion of the inclination surface, which is located between the vicinity of the center of the inclination surface of the vibration transmitting portion 16 and a leading end (indicated by "f" in FIG. 6C) of a lower portion of the vibration transmitting portion 16, specifically, an end on the piezoelectric element receiving portion 21 side, is deformed so as to form a steep inclination.

Further, the piezoelectric element receiving portion 21 is deformed in the same direction as that of the deformation of the piezoelectric element 3. At the same time, the flange portion 23 is also deformed so as to expand in the radial direction. As a result, the vibration surface 17 formed continuous with the vibration member 15 is located at a lower position.

As described above, the piezoelectric element 3 is deformed in the radial direction to repeat the expansion and the contraction. As a result, the piezoelectric element receiving portion 21 of the vibration member 15 is deformed in the same direction as that of the deformation of the piezoelectric element. The vibration surface 17 of the vibration member 15 is vibrated in the direction orthogonal to the vibration direction of the piezoelectric element. Further, the vibration member 15 also acts as a vibration-direction converter configured to convert the vibration direction of the radial vibration of the piezoelectric element 3.

As described above, in the ultrasonic transducer according to the present invention, after the radial vibration being the vibration caused by the transverse effect of the area expansion vibration of the piezoelectric element is converted to the vibration in the direction orthogonal to the vibration direction of the radial vibration with use of the vibration member without using a vibration in a longitudinal direction of a piezoelectric element as used in the related art, vibrations at a low frequency are generated. Thus, the ultrasonic transducer can be downsized.

[Configuration of Spot Shower Type Ultrasonic Cleaning Device]

Next, a spot shower type ultrasonic cleaning device as a first embodiment of the cleaning device using the ultrasonic transducer is described with reference to FIG. 7 to FIG. 9.

Figure 7:
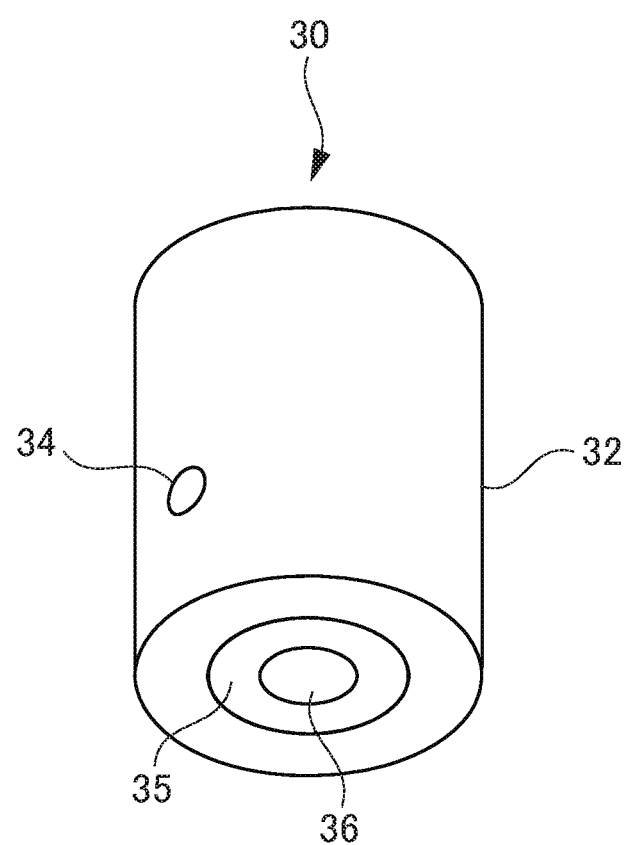
FIG. 7 is a perspective view for illustrating a spot shower type ultrasonic cleaning device.
Figure 8:
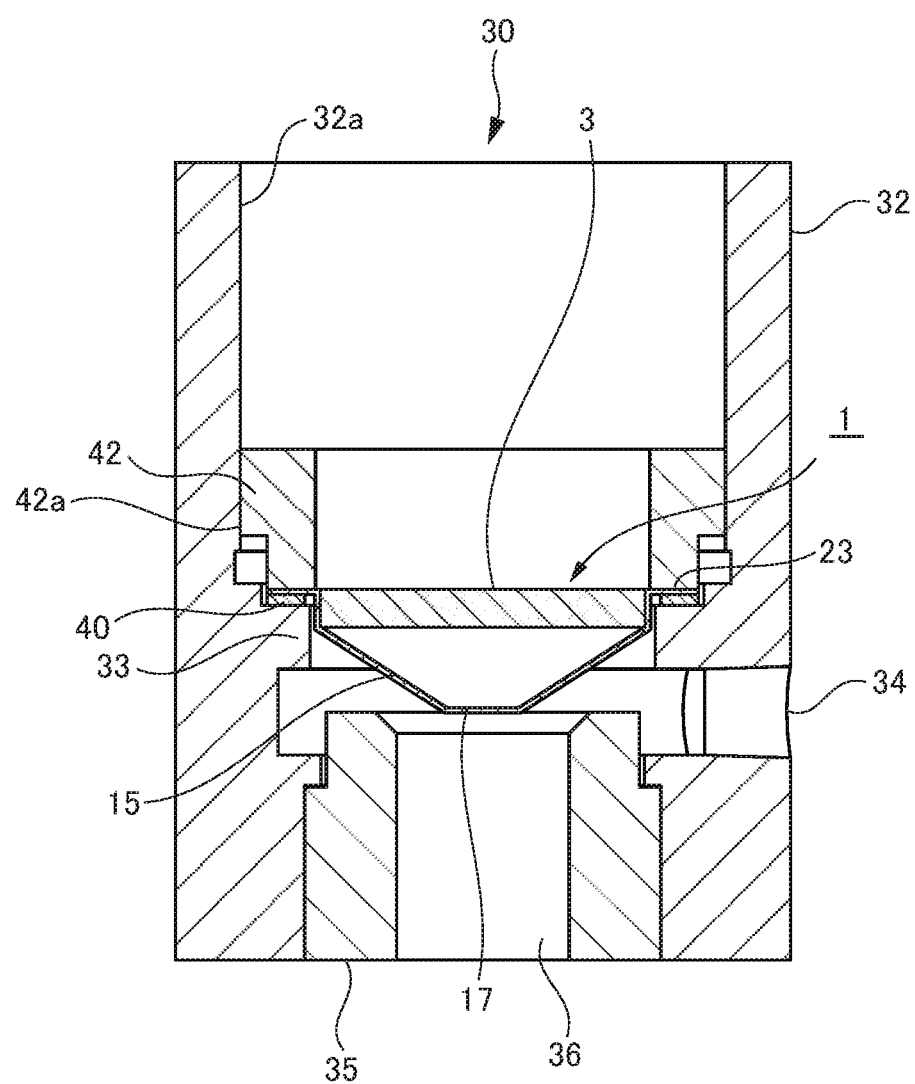
FIG. 8 is a sectional view for illustrating the spot shower type ultrasonic cleaning device.
Figure 9:
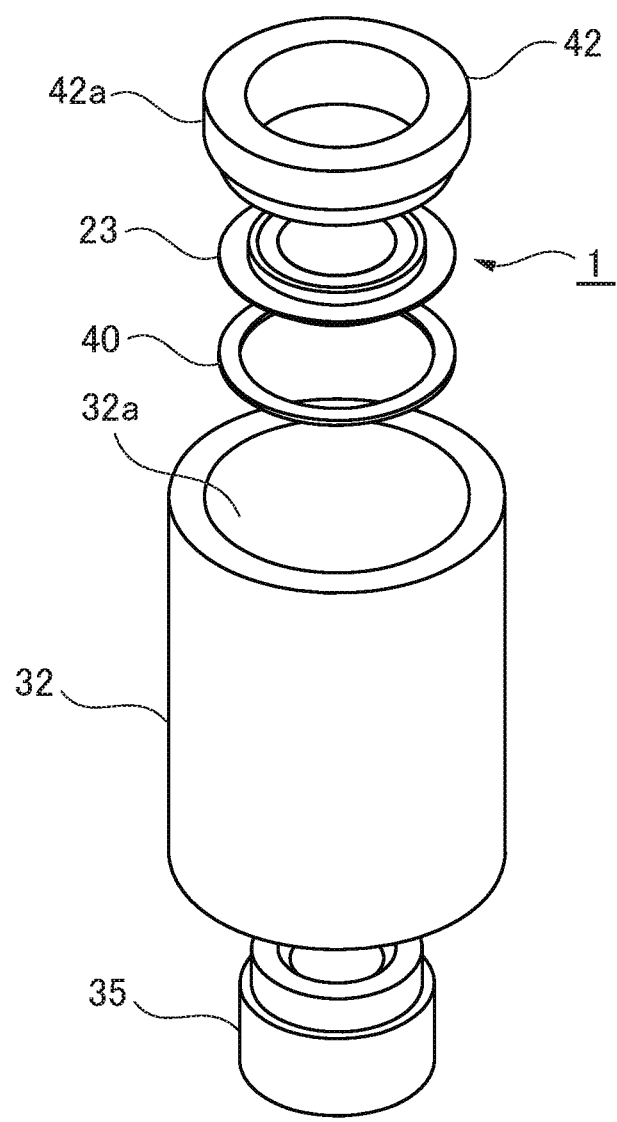
FIG. 9 is a developed perspective view for illustrating parts assembled into a casing of the spot shower type ultrasonic cleaning device.

FIG. 7 is a perspective view for illustrating a spot shower type ultrasonic cleaning device, FIG. 8 is a sectional view of the spot shower type ultrasonic cleaning device, and FIG. 9 is a developed perspective view for illustrating parts assembled into a casing of the spot shower type ultrasonic cleaning device. In FIG. 8, the illustration of the electrodes provided on the surfaces of the piezoelectric element is omitted.

As illustrated in FIG. 7 and FIG. 8, a spot shower type ultrasonic cleaning device 30 includes a casing 32, the ultrasonic transducer 1, and a nozzle 35. The ultrasonic transducer 1 is built in the casing 32. The nozzle 35 is mounted to a leading end of the casing 32. The ultrasonic transducer 1 has the same configuration as the ultrasonic transducer 1 illustrated in FIG. 1, and therefore the description thereof is herein omitted.

As illustrated in FIG. 7 and FIG. 8, the casing 32 of the spot shower type ultrasonic cleaning device 30 has an approximately cylindrical shape. A liquid supply port 34 for supplying the cleaning liquid to the ultrasonic transducer 1 and a power supply port (not shown) for supplying electric power to the ultrasonic transducer 1 are formed in a side surface of the casing 32. Further, the vibration surface 17 arranged in parallel to the piezoelectric element 3 in the ultrasonic transducer 1 is mounted so as to be opposed to the nozzle 35.

As illustrated in FIG. 8 and FIG. 9, the nozzle 35 and a receiving portion 33 having a ring shape are provided inside the casing 32 of the spot shower type ultrasonic cleaning device 30. The nozzle 35 is provided to a leading end of the casing 32, and is configured to eject the cleaning liquid. The receiving portion 33 is configured to mount and fix the ultrasonic transducer 1 inside the casing 32, and is formed in a projecting manner. A packing 40 having a ring shape is mounted to an upper surface of the receiving portion 33. The flange portion 23 of the ultrasonic transducer 1 is located on an upper surface of the packing 40. An upper surface of the flange portion 23 is pressed by a pressure ring 42 against the casing 32 so that the ultrasonic transducer 1 is fixed to the casing 32.

A thread portion (not shown) is formed on an upper portion 32a of an inner side of the casing 32 of the spot shower type ultrasonic cleaning device 30. A thread (not shown) is formed on a side surface 42a. The pressure ring 42 is threadably fitted into the upper portion of the inner side of the casing so as to press and fix the ultrasonic transducer 1.

The nozzle 35 has a cylindrical shape, which has a male thread (not shown) formed on an outer periphery and a discharge hole 36 therein. The nozzle 35 is mounted to the leading end of the casing 32. An upper portion of the nozzle 35 is opposed to the vibration surface 17 of the vibration member 15 in the ultrasonic transducer 1. An outer periphery of a hole diameter of an upper portion of the discharge hole 36 formed in the nozzle 35 is chamfered. The discharge hole 36 is formed so that a hole diameter of the upper portion of the discharge hole 36 becomes larger than a hole diameter of a lower portion of the discharge hole 36.

The ultrasonic transducer 1 of the spot shower type ultrasonic cleaning device is the ultrasonic transducer 1 illustrated in FIG. 1. With supply of electric power having a frequency equal to or lower than 200 kHz by the ultrasonic oscillator, the ultrasonic transducer 1 generates ultrasonic vibrations. As a result, the vibration surface 17 of the ultrasonic transducer 1 is vibrated in the direction orthogonal to the front surface of the vibration surface 17 to apply the ultrasonic vibrations to the cleaning liquid supplied through the liquid supply port 34. As a result, the cleaning liquid flows into the discharge hole 36 of the upper portion of the nozzle 35 to eject the cleaning liquid, to which the ultrasonic vibrations are applied, from a leading end of the nozzle 35.

As described above, the spot shower type ultrasonic cleaning device applies the ultrasonic waves emitted from the ultrasonic transducer 1 to the cleaning liquid supplied through the liquid supply port 34 to eject (jet) an ultrasonic cleaning liquid from the leading end of the nozzle 35 to thereby clean an object to be cleaned arranged in front of the nozzle 35.

In the manner described above, the spot shower type ultrasonic cleaning device 30 can eject the cleaning liquid to a narrow range at a specific portion of the object to be cleaned, and hence the cleaning liquid can be reduced.

Further, the ultrasonic transducer 1 includes the vibration member 15. The vibration member 15 includes the piezoelectric element 3 having the resonance frequency equal to or lower than 200 kHz in the radial vibration, and is configured to convert the radial vibration into the vibration in the direction orthogonal to the vibration direction of the radial vibration. As a result, the spot shower type ultrasonic cleaning device using the ultrasonic transducer 1 can be downsized.

Further, the ultrasonic transducer 1 maintains substantially the same dimensions as those of a related-art spot shower type ultrasonic cleaning device using a high-frequency wave. As a result, the ultrasonic transducer 1 can be commonly used in the related-art spot shower type ultrasonic cleaning device or can be used in place of an ultrasonic transducer used in the related-art spot shower type ultrasonic cleaning device.

[Configuration of Cleaning Bath Type Ultrasonic Cleaning Device]

Next, a cleaning bath type ultrasonic cleaning device as a second embodiment, of the cleaning device using the ultrasonic transducer is described with reference to FIG. 10 to FIG. 13.

Figure 12:
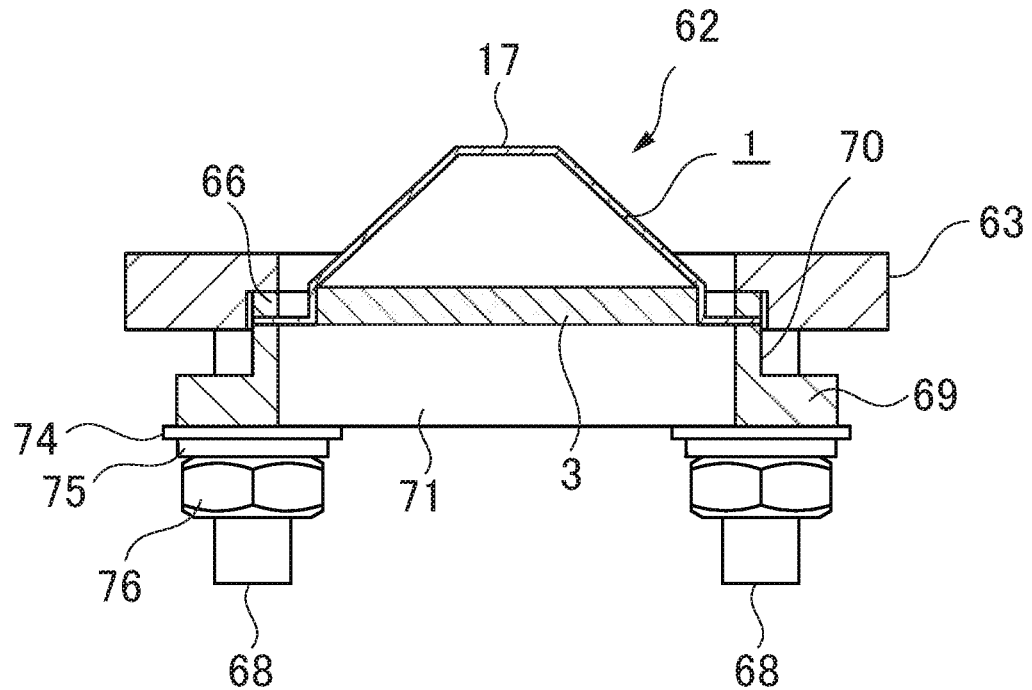
FIG. 12 is a sectional view for illustrating the mounting of the ultrasonic transducer assembled to the bottom portion of the cleaning bath in the cleaning bath type ultrasonic cleaning device.
Figure 13:
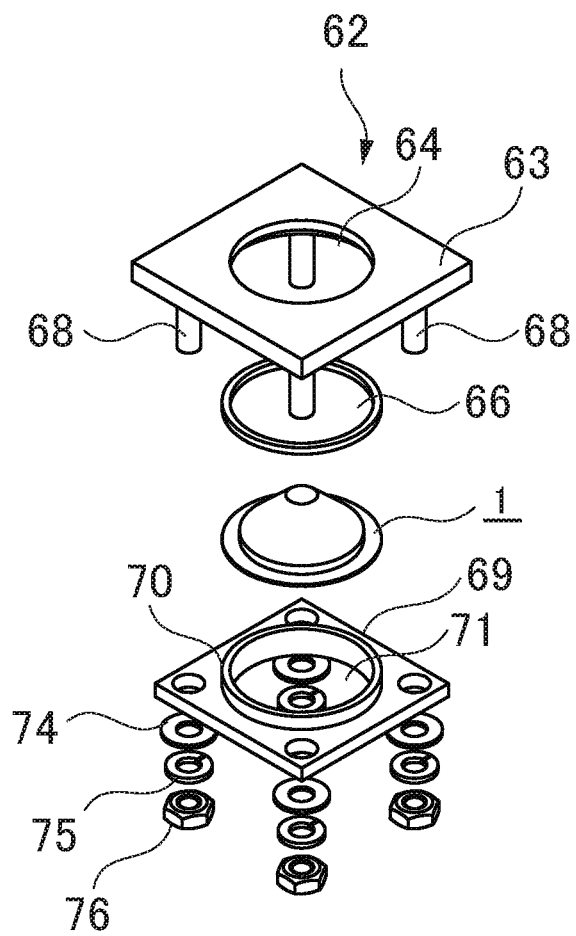
FIG. 13 is a developed perspective view for illustrating parts including the ultrasonic transducer assembled into the cleaning bath of the cleaning bath type ultrasonic cleaning device.
Figure 14:
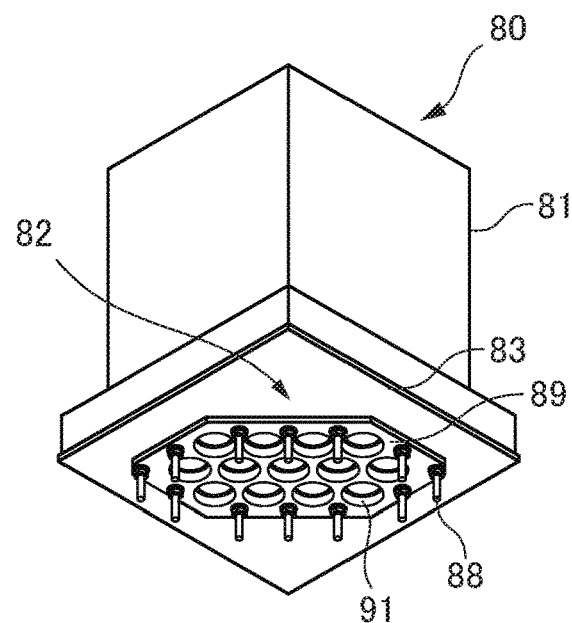
Figure 14:
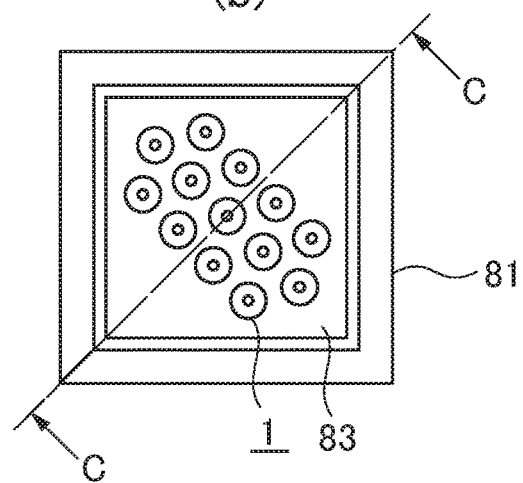
Figure 14:
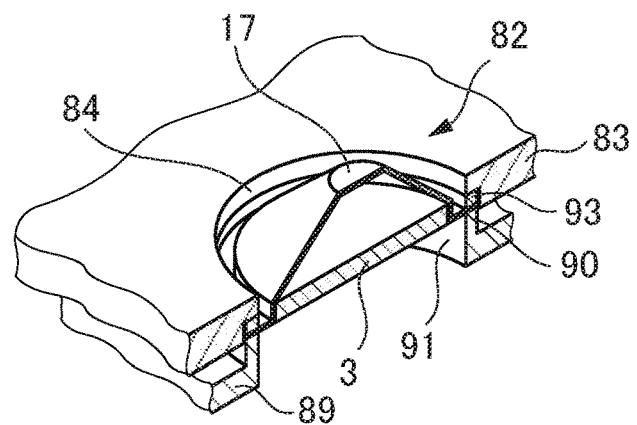

FIG. 10 is a perspective view for illustrating mounting of an ultrasonic transducer assembled to a bottom portion of a cleaning bath in a cleaning bath type ultrasonic cleaning device, FIG. 11 is a perspective view for illustrating the mounting of the ultrasonic transducer assembled to the bottom portion of the cleaning bath in the cleaning bath type ultrasonic cleaning device when viewed from above, FIG. 12 is a sectional view for illustrating the mounting of the ultrasonic transducer assembled to the bottom portion of the cleaning bath in the cleaning bath type ultrasonic cleaning device, and FIG. 13 is a developed perspective view for illustrating parts including the ultrasonic transducer assembled into the cleaning bath of the cleaning bath type ultrasonic cleaning device. FIG. 14 are configuration diagrams for illustrating the cleaning bath having a vibrator mounting flat plate to which a plurality of ultrasonic transducers are mounted, in which FIG. 14A is a perspective view of the cleaning bath when viewed from the bottom portion, FIG. 14B is a plan view of the cleaning bath, and FIG. 14C is a sectional view taken along the line C-C of FIG. 14B.

In FIG. 8 and FIG. 12, the illustration of the electrodes provided on the surfaces of the piezoelectric element is omitted.

Further, FIG. 11 is a perspective view in which illustration of a cleaning bath 61 is omitted for illustration of the mounting of the ultrasonic transducer. Further, in FIG. 14C, the illustration of the electrodes provided on the surfaces of the piezoelectric element is omitted.

As illustrated in FIG. 10 and FIG. 11, an ultrasonic vibration portion 62 provided on a bottom portion of the cleaning bath 61 of a cleaning bath type ultrasonic cleaning device 60 includes a vibrator mounting flat plate 63 to which the ultrasonic transducer 1 is mounted.

As illustrated in FIG. 12 and FIG. 13, an opening portion 64 (illustrated in FIG. 13) is formed at a center of main surfaces of the vibrator mounting flat plate 63. Stud bolts 68 are provided to one of the surfaces of the vibrator mounting flat plate 63. Another one of the surfaces of the vibrator mounting flat plate 63 is located on the cleaning bath side, and thus is to be brought into contact with the cleaning liquid. Further, the ultrasonic transducer 1 is mounted on the one surface of the vibrator mounting flat plate 63 through a packing 66 therebetween.

The ultrasonic transducer 1 as the ultrasonic transducer 1 illustrated in FIG. 1. The ultrasonic transducer 1 is mounted so that the vibration surface 17 arranged in parallel to the piezoelectric element 3 projects into the cleaning bath 61 through the opening portion 64 of the vibrator mounting flat plate 63.

Further, as illustrated in FIG. 13, a press plate 69 has an approximate square shape. The press plate 69 has an opening portion 71 formed in the vicinity of a center, and a projecting portion 70 is formed on an entire periphery of an end surface of the opening portion 71. Holes for allowing insertion of the stud bolts 68 are formed at four corners of the press plate 69.

After the ultrasonic transducer 1 is mounted so that the stud bolts 68 pass through the holes of the press plate 69, a lower surface of the flange portion 23 of the ultrasonic transducer 1 is pressed by the projecting portion 70 having the ring shape against the vibrator mounting flat at plate 63 through the packing 66 therebetween to thereby fix the ultrasonic transducer 1 to the vibrator mounting flat plate 63. As illustrated in FIG. 13, the press plate 69 is fixed with use of nuts 76 through washers 74 and spring washers 75 therebetween.

In an embodiment illustrated in FIG. 10, one ultrasonic transducer 1 is mounted onto one vibrator mounting flat plate 63. In the ultrasonic cleaning device according to the present invention, a plurality of the ultrasonic transducers 1 can be mounted onto the vibrator mounting flat plate 63.

Now, an ultrasonic cleaning device including a plurality of the ultrasonic transducers provided to a cleaning bath is described with reference to FIG. 14.

As illustrated in FIG. 14A, an ultrasonic cleaning device 80 includes an ultrasonic vibration portion 82 provided to a bottom surface of a cleaning bath 81. A plurality of the ultrasonic transducers 1 are mounted to a vibrator mounting flat plate 83 having a surface corresponding to the bottom surface of the cleaning bath 81. Opening portions 84 (illustrated in FIG. 14C) corresponding to the number of ultrasonic transducers 1 to be mounted are formed through main surfaces of the vibrator mounting flat plate 83 so as to be spaced away from each other by a predetermined distance. Stud bolts 88 are provided at positions along an outer peripheral shape of a press plate 89 on one surface of the vibrator mounting flat plate 83. Another surface of the vibrator mounting flat plate 83 forms a bottom of the cleaning bath 81, and thus is to be brought into contact with the cleaning liquid.

The ultrasonic transducer 1 is the ultrasonic transducer 1 illustrated in FIG. 1. As illustrated in FIG. 14B and FIG. 14C, the ultrasonic transducer 1 is mounted so that the vibration surface 17 arranged in parallel to the piezoelectric element 1 projects into the cleaning bath 81 through the opening portion 84 of the vibrator mounting flat plate 83.

Further, as illustrated in FIG. 14A and FIG. 14C, a press plate 89 has a protruding hexagonal shape. The press plate 89 has an opening portion 91 formed in the vicinity of a center, and a projecting portion 90 is formed on an entire periphery of an end surface of the opening portion 91. Holes for allowing insertion of the stud bolts 88 are formed on an entire periphery of the press plate 89.

After the ultrasonic transducer 1 is mounted so that the stud bolts 88 pass through the holes of the press plate 89, a lower surface of the flange portion 23 of the ultrasonic transducer 1 is pressed by the projecting portion 90 having the ring shape against the vibrator mounting flat plate 83 through the packing 93 therebetween to thereby fix the ultrasonic transducer 1 to the vibrator mounting flat plate 83.

As in FIG. 12, the press plate 89 is fixed with use of nuts through washers and spring washers therebetween.

For the ultrasonic cleaning device using the ultrasonic transducer according to the present invention, the arrangement of the ultrasonic transducers on the vibrator mounting flat plate and the number of ultrasonic transducers to be used are not limited to those illustrated in FIG. 14. For example, the arrangement of the ultrasonic transducers on the bottom surface of the cleaning bath and the number of ultrasonic transducers to be used may be suitably selected.

Figure 15:
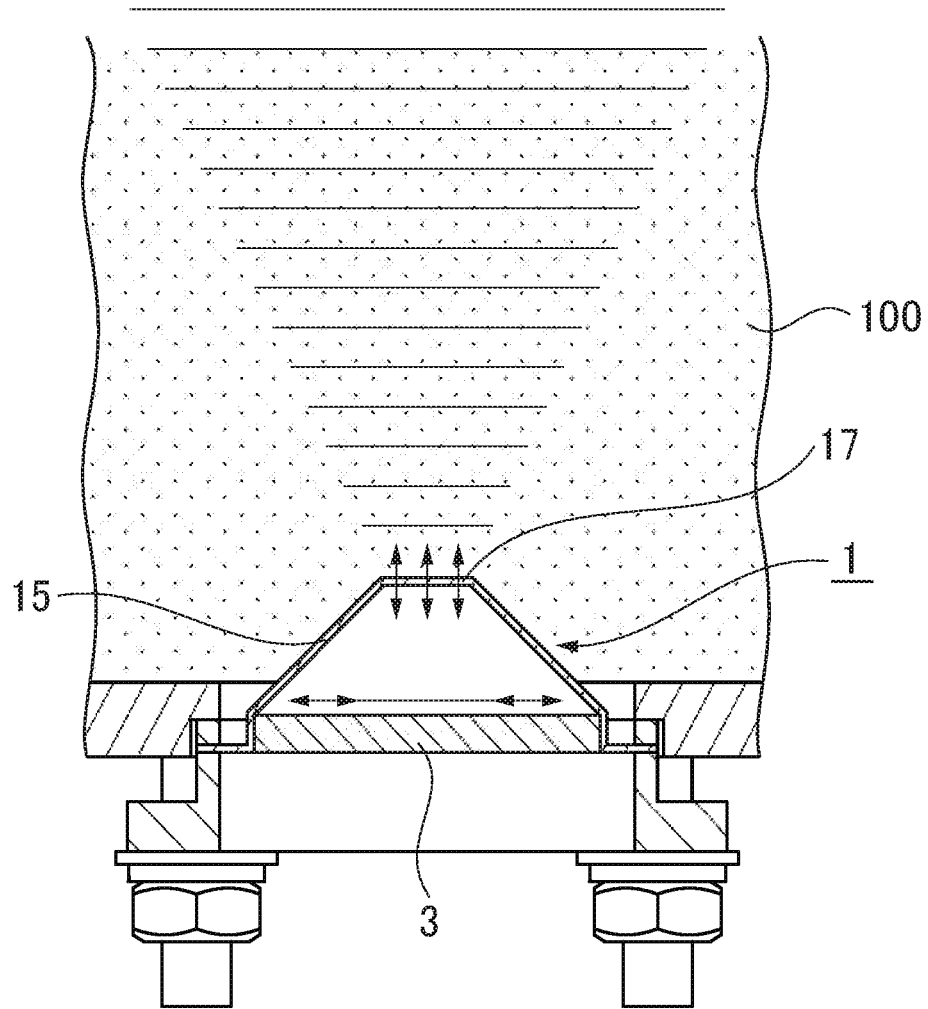
FIG. 15 is a view including a partial cross section, for illustrating an ultrasonic irradiation state in the cleaning bath through vibrations of the ultrasonic transducer assembled to the cleaning bath of the ultrasonic cleaning device.

FIG. 15 is a view including a partial cross section, for illustrating an ultrasonic irradiation state in a cleaning bath with the vibrations generated by the ultrasonic transducer assembled into the cleaning bath of the ultrasonic cleaning device. In FIG. 15, the illustration of the electrodes provided on the surfaces of the piezoelectric element is omitted. As illustrated in FIG. 15, the piezoelectric element 3 of the ultrasonic transducer 1 is vibrated in the radial direction indicated by the arrows. With the vibrations in the radial direction, the vibration surface 17 of the vibration member 15 is vibrated in a vertical direction indicated by the arrows to apply ultrasonic vibrations to a cleaning liquid 100. Further, when a plurality of the ultrasonic transducers 1 are provided in accordance with a size of the bottom surface of the cleaning bath, the cleaning liquid in the cleaning bath can be entirely irradiated with the ultrasonic waves.

The ultrasonic cleaning device according to the present invention does not have such a structure that the ultrasonic transducer is directly bonded to the cleaning bath. Thus, when the ultrasonic transducer 1 is in failure, the ultrasonic transducer 1 in failure can be replaced. Accordingly, for example, replacement and maintenance can easily be carried out.

As described above, according to the present invention, after the radial vibration being the vibration caused by the transverse effect of the area expansion vibration of the piezoelectric element is converted to the vibration in the direction orthogonal to the vibration direction of the radial vibration in the area expansion vibration mode with use of the vibration member without using a thickness vibration of a circular plate of a piezoelectric element as used in the related art, vibrations at a low frequency are generated. Thus, even the ultrasonic transducer, which generates vibrations at a low frequency, can be downsized.

Further, as a result of the downsizing of the piezoelectric element, which is achieved with use of the piezoelectric element having the area expansion vibration mode, the piezoelectric element can be mounted to a casing of a related-art spot shower type ultrasonic cleaning device.

Further, with adaptation of a spot shower type as a cleaning mode, a portion of an object to be cleaned, which is required to be cleaned, can be selected. Hence, the amount of cleaning liquid required for cleaning can be reduced.

Further, a Langevin vibrator, which has been hitherto used, has a length in a longitudinal direction of the Langevin vibrator, which varies depending on a vibration frequency. Thus, for a low vibration frequency, a thickness of the vibrator is increased. Meanwhile, a resonance frequency of a circular plate type piezoelectric ceramic for the piezoelectric element can be changed by changing a magnitude of a diameter of the circular plate type piezoelectric ceramic. Thus, the circular plate type piezoelectric ceramic can be downsized without increasing a thickness of the vibrator depending on the vibration frequency.

Further, as a vibrator input for the piezoelectric ceramic for the piezoelectric element, electric power up to about 10 W/cm$^2$ can be input, and hence large vibrations can be obtained. Thus, a sufficient cleaning force can be obtained with use of even one piezoelectric element.

Further, the piezoelectric element of the ultrasonic transducer according to the present invention has the area expansion vibration mode. The piezoelectric element can be formed to have such a shape that is surrounded by the vibration member and is easily shielded, such as a circular plate-like shape or a protruding polygonal shape. Thus, contact of the piezoelectric element with the liquid can easily be prevented.

The ultrasonic transducer according to the present invention can also be used for the ultrasonic cleaning device including a cleaning bath.

Further, the piezoelectric ceramic for the piezoelectric element can generate strong vibrations, and thus can be applied to a dispersion treatment or an emulsification treatment, which uses the ultrasonic vibrations.

The present invention can be embodied in a large number of forms without departing from the essential characteristics thereof. Thus, the above-mentioned embodiment is exclusive for description, and it is to be understood that the present invention is not limited to the above-mentioned embodiment.

What is claimed is:

1. An ultrasonic transducer configured to apply an ultrasonic vibration to a liquid, comprising:
    a piezoelectric element, which has a plate-like shape, and has an area expansion vibration mode; and
    a vibration member comprising a vibration surface, which is separated from main surfaces of the piezoelectric element, and is arranged in parallel to the main surfaces so as to be brought into contact with the liquid, a piezoelectric element receiving portion, which is held in contact with a side surface of the piezoelectric element, and is configured to fix the piezoelectric element, and a vibration transmitting portion for connecting the vibration surface and the piezoelectric element receiving portion, the vibration member having a space for surrounding the main surface, which is formed by the vibration surface, the piezoelectric element receiving portion, and the vibration transmitting portion,
    wherein a vibration generated by the piezoelectric element is transmitted to the vibration surface through the piezoelectric element receiving portion and the vibration transmitting portion, and the vibration surface is vibrated in a direction orthogonal to a vibration direction of the piezoelectric element in the area expansion vibration mode.

2. The ultrasonic transducer according to claim 1, wherein the ultrasonic vibration has a vibration frequency of 200 kHz or lower.

3. The ultrasonic transducer according to claim 2, wherein a vibration in the area expansion vibration mode is a vibration caused by a transverse effect, and includes a length vibration, as area vibration, and a radial vibration.

4. The ultrasonic transducer according to claim 2,
    wherein the piezoelectric element is formed in a circular plate-like shape, and
    wherein the vibration member is formed in a truncated conical shape or a columnar shape, which has the vibration surface at a leading end.

5. The ultrasonic transducer according to claim 2,
    wherein the piezoelectric element is formed in a protruding polygonal shape, and wherein the vibration member is formed in a truncated pyramid shape or a prismatic shape, which corresponds to the protruding polygonal shape having the vibration surface at a leading edge.

6. The ultrasonic transducer according to claim 2, further comprising a flange portion formed so as to be continuous with the piezoelectric element receiving portion, wherein the flange portion extends in the vibration direction in the area expansion vibration mode.

7. The ultrasonic transducer according to claim 2, wherein the piezoelectric element has a hole portion passing through the main surfaces of the piezoelectric element.

8. The ultrasonic transducer according to claim 7, wherein the hole portion is formed at an approximate center of the main surfaces.

9. The ultrasonic transducer according to claim 2, wherein the piezoelectric element is fixed to the vibration member through fitting or an adhesive.

10. An ultrasonic cleaning device of a spot shower type, which is configured to jet a cleaning liquid in a shower-like manner, the ultrasonic cleaning device comprising the ultrasonic transducer of claim 1, which is provided in the ultrasonic cleaning device, and is configured to apply an ultrasonic vibration to the cleaning liquid.

11. An ultrasonic cleaning device, which is configured to store a cleaning liquid in a cleaning bath and immerse an object to be cleaned into the cleaning bath so as to perform cleaning, the ultrasonic cleaning device comprising the ultrasonic transducer of claim 1, which is provided inside the cleaning bath, and is configured to apply an ultrasonic vibration to the cleaning liquid.

\* \* \* \* \*